United States Patent
Fedynyshyn et al.

(10) Patent No.: US 8,323,866 B2
(45) Date of Patent: Dec. 4, 2012

(54) INORGANIC RESIST SENSITIZER

(75) Inventors: Theodore H. Fedynyshyn, Sudbury, MA (US); Russell B. Goodman, Hingham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 593 days.

(21) Appl. No.: 12/497,851

(22) Filed: Jul. 6, 2009

(65) Prior Publication Data

US 2010/0021843 A1    Jan. 28, 2010

Related U.S. Application Data

(60) Provisional application No. 61/078,939, filed on Jul. 8, 2008, provisional application No. 61/091,028, filed on Aug. 22, 2008.

(51) Int. Cl.
*G03F 7/00* (2006.01)
*G03F 7/004* (2006.01)
*G03F 7/20* (2006.01)
*G03F 7/40* (2006.01)
*G03F 7/075* (2006.01)

(52) U.S. Cl. ............... 430/270.1; 430/322; 430/331; 430/5; 430/396; 430/913; 430/926; 430/942

(58) Field of Classification Search ............... 430/270.1, 430/913, 926, 331, 322, 942, 5, 396
See application file for complete search history.

(56) References Cited

U.S. PATENT DOCUMENTS

| | | | |
|---|---|---|---|
| 4,535,053 A | 8/1985 | West et al. | |
| 4,578,344 A | 3/1986 | Griffing et al. | |
| 4,591,546 A | 5/1986 | West et al. | |
| 4,672,021 A | 6/1987 | Blumel et al. | |
| 4,677,049 A | 6/1987 | Griffing et al. | |
| 4,693,960 A | 9/1987 | Babich et al. | |
| 4,702,996 A | 10/1987 | Griffing et al. | |
| 4,777,111 A | 10/1988 | Blumel et al. | |
| 4,804,614 A | 2/1989 | Halle | |

(Continued)

FOREIGN PATENT DOCUMENTS

EP    0 435 531 A2    7/1991

(Continued)

OTHER PUBLICATIONS

International Search Report from corresponding PCT/US09/049682, mailed Oct. 29, 2009.

(Continued)

*Primary Examiner* — Amanda C. Walke
(74) *Attorney, Agent, or Firm* — Nutter McClennen & Fish LLP

(57) ABSTRACT

Methods and compositions for enhancing the sensitivity of an inorganic resist composition are disclosed. In one aspect, compositions for use with a matrix material (e.g., a lithographically sensitive polymeric material such as a hydrogen-bearing siloxane material) can be formulated with a sensitizer, where the sensitizer can be present in a relatively small amount. The sensitizer can include a radical generator, and can act to enhance the efficiency of radical generation and/or resist crosslinking when the resist is impinged by a selected lithographic radiation. The methods of the present invention can be especially useful in performing short wavelength (e.g., less than 200 nm) lithography, or for processes such as e-beam lithography, which traditionally suffer from low throughput. Methods of utilizing one or more of these aspects are also disclosed.

31 Claims, 2 Drawing Sheets

U.S. PATENT DOCUMENTS

| | | | |
|---|---|---|---|
| 4,859,789 A | 8/1989 | Griffing et al. | |
| 4,871,646 A | 10/1989 | Hayase et al. | |
| 4,921,321 A | 5/1990 | Weidman | |
| 4,942,113 A | 7/1990 | Trundle | |
| 4,990,665 A | 2/1991 | Griffing et al. | |
| 5,055,439 A | 10/1991 | Allen et al. | |
| 5,108,874 A | 4/1992 | Griffing et al. | |
| 5,164,278 A | 11/1992 | Brunsvold et al. | |
| 5,171,656 A | 12/1992 | Sebald et al. | |
| 5,204,226 A | 4/1993 | Baier et al. | |
| 5,238,787 A * | 8/1993 | Haluska et al. | 430/325 |
| 5,272,036 A | 12/1993 | Tani et al. | |
| 5,330,881 A | 7/1994 | Sidman et al. | |
| 5,372,908 A | 12/1994 | Hayase et al. | |
| 5,391,442 A | 2/1995 | Tsushima et al. | |
| 5,426,160 A | 6/1995 | Bianconi et al. | |
| 5,439,780 A | 8/1995 | Joshi et al. | |
| 5,476,753 A | 12/1995 | Hashimoto et al. | |
| 5,776,764 A | 7/1998 | Ueta | |
| 5,780,163 A * | 7/1998 | Camilletti et al. | 428/446 |
| 5,795,700 A | 8/1998 | Hatakeyama et al. | |
| 5,804,257 A | 9/1998 | Hayashida et al. | |
| 5,902,713 A | 5/1999 | Hada et al. | |
| 5,932,378 A * | 8/1999 | Lee | 430/5 |
| 6,015,625 A * | 1/2000 | Morizono et al. | 428/500 |
| 6,025,117 A | 2/2000 | Nakano et al. | |
| 6,066,433 A | 5/2000 | Takemura et al. | |
| 6,087,064 A * | 7/2000 | Lin et al. | 430/270.1 |
| 6,318,528 B1 * | 11/2001 | Blanckaert | 190/119 |
| 6,344,309 B2 | 2/2002 | Fukushima et al. | |
| 6,479,212 B1 | 11/2002 | Matsuda et al. | |
| 6,759,502 B1 | 7/2004 | Tang et al. | |
| 6,989,428 B1 | 1/2006 | Bianconi et al. | |
| 7,060,637 B2 | 6/2006 | Li et al. | |
| 7,112,615 B2 | 9/2006 | Gleason et al. | |
| 7,479,361 B2 | 1/2009 | Nagahara et al. | |
| 7,625,687 B2 * | 12/2009 | Hu et al. | 430/270.1 |
| 7,629,596 B2 * | 12/2009 | Taniguchi | 250/492.2 |
| 8,034,545 B2 * | 10/2011 | Sakurai et al. | 430/322 |
| 2004/0043328 A1 | 3/2004 | Lu | |
| 2004/0081912 A1 | 4/2004 | Nagahara et al. | |
| 2004/0132857 A1 * | 7/2004 | Barton et al. | 522/168 |
| 2005/0266344 A1 * | 12/2005 | Sakurai et al. | 430/270.1 |
| 2007/0264587 A1 * | 11/2007 | Hu et al. | 430/18 |
| 2008/0076060 A1 | 3/2008 | Fedynyshyn | |
| 2008/0227883 A1 * | 9/2008 | Kojima et al. | 522/18 |
| 2010/0009289 A1 | 1/2010 | Fedynyshyn | |

FOREIGN PATENT DOCUMENTS

| | | |
|---|---|---|
| EP | 0 445 058 A1 | 9/1991 |
| EP | 0 502 677 | 9/1992 |
| EP | 0 780 729 A1 | 6/1997 |
| EP | 0 816 419 A | 1/1998 |
| JP | 23574/1979 | 9/1980 |
| JP | 1106049 | 4/1989 |
| JP | 2000 194128 | 7/2000 |
| JP | 2000 194128 A | 7/2000 |
| JP | 2003162064 A | 6/2003 |

OTHER PUBLICATIONS

Bianconi, P.A. et al., "Poly(n-hexylsilyne): Synthesis and Properties of the First Alkyl Silicon [RSi]$_n$ Network Polymer," J. Am. Chem. Soc. 110:2342-44 (1988).

CIBA Specialty Chemicals, Photoinitiators for UV Curing, Key Products Selection Guide.

Dabbagh, G. et al., "Positive Tone Processing of Plasma Polymerized Methylsilane," SPIE 3333:394-400.

Hofer, D.C. et al., "Contrast Enhanced UV Lithography with Polysilanes," SPIE—Advances in Resist Tech. 469:108-16 (1984).

Horn, M.W. et al., "Plasma-Deposited Organosilicon Thin Films as Dry Resists for Deep Ultraviolet Lithography," J. Vas. Sci. Technol. B 8(6):1493-1496 (1990).

International Search Report from corresponding PCT Appl No. PCT/US08/69413, dated Mar. 3, 2009.

Jeyakumar, A., "Development of inorganic Resists for Electron Beam Lithography: Novel Materials and Simulations," Thesis, Georgia Institute of Technology School of Chemical & Biomolecular Engineering (May 2004).

Kunz, R.R. et al., "Photo-Oxidation of σ-Conjugated Si-Si Network Polymers," J. Vas. Sci. Technol. A 9(3):1447-51 (1991).

Kunz, R.R. et al., "Polysilyne Resists for 193-nm Excimer Laser Lithography," SPIE—Advances in Resist Tech. & Proc. VIII 1466:218-226 (1991).

Kunz, R.R. et al., "Polysilyne Thin Films as Resists for Deep Ultraviolet Lithography," J. Vac. Sci. Technol. B 8(6):1820-25 (1990).

Lalevee, J. et al., "Photocleavage Processes in an Iminosulfonate Derivative Usable as Photoacid in Resist Technology," Chem. Ltrs. 32(2):178-79 (2003).

Lange, B. et al., "3D Defect Engineering in Polymer Opals," Proc. SPIE 6182 (2006).

Linehan, L. et al., "INR: A Negative Tone I-Line Chemically Amplified Photoresist," SPIE 2195:307-319.

Miller, R.D. et al., Polysilanes: Photchemistry and Deep UV Lithography, Society of Plastic Engineers, Inc., Photopolymers: Principles, Processes and Materials—Regional Technical Conference, Brookfield Center, CT pp. 111-120 (Oct. 30-Nov. 2, 1988).

Miller, R.D., "New Materials for Optical Microlithography," J. Imaging Sci. 31(2):43-46 (1987).

Miller, R.D., "Polysilane High Polymers," Chem. Rev. 89:1359-1410 (1989).

Miller, R.D., "Polysilanes: Radiation Sensitive Materials for Microlithography," Polymer Preprints, Div. Polymer Chem., Am. Chem. Soc. 31(2):252-53 (1990).

Nouveau, A. et al., "Synthesis and Photoresist Properties of Copolymers of Trimethylsilylmethyl Methacrylate and Oximinoketones Methacrylates," Society of Plastic Engineers, Inc., Photopolymers: Principles, Processes and Materials—Regional Technical Conference, Brookfield Center, CT pp. 339-351 (Oct. 30-Nov. 2, 1988).

Noppakundilograt, S. et al., "Vis-sensitive Photopolymer Containing Vinyl Ether Compound and Pyrromethene Dye," Polym. Adv. Technol. 13:527-33 (2002).

Peng, C. et al., "The Design of Silicon-Based Polyimide as a Submicron Resolution Directly Imagable Electron Beam Resist," Society of Plastic Engineers, Inc., Photopolymers: Principles, Processes and Materials—Regional Technical Conference, Brookfield Center, CT pp. 373-392 (Oct. 30-Nov. 2, 1988).

Pohlers, G. et al., "Ionic vs Free Radical Pathways in the Direct and Sensitized Photchemistry of 2-(4'-Methoxynaphthyl)-4,6-bis(trichloromethyl)-1,3,5-triazine: Relevance for Photoacid Generation," J. Am. Chem. Soc. 121:6167-75 (1999).

Rosilio, C. et al., "Contribution to the Study of Polysilanes for Photolithography," Microelectronic Eng. 6(1-4):399-406 (1987).

Rosilio, C. et al., "Contribution to the Study of Polysilanes for High-Resolution Photolithography," Microelectronic Eng. 8(1-2):55-78 (1988).

Rosilio, C. et al., "Design of Silicon Containing Resists for Deep UV Bilayer Lithography," Society of Plastic Engineers, Inc., Photopolymers: Principles, Processes and Materials—Regional Technical Conference, Brookfield Center, CT pp. 145-155 (Oct. 30-Nov. 2, 1988).

Rothschild, et al., "Effects of Excimer Laser Irradiation on the Transmission, Index of Refraction, and Density of Ultraviolet Grade Fused Silica," Appl. Phys. Lett. 55(13):1276-78 (1989).

Selvaraju, C. et al., "Excited State Reactions of Acridinedione Dyes with Onium Salts: Mechanistic Details," J. Photochem. & Photobiol. A:Chem. 138:213-26 (2001).

Sezi, R. et al., "Silicon Containing Resists for I-Line and Deep-UV Application," Society of Plastic Engineers, Inc., Photopolymers: Principles, Processes and Materials—Regional Technical Conference, Brookfield Center, CT pp. 133-143 (Oct. 30-Nov. 2, 1988).

ShinEtsuMicroSi Contrast Enhancement Materials pamphlet, Phoenix, AZ (revised Aug. 12, 2003), available at http://www.microsi.com/photolithography/cem.htm (obtained on Apr. 8, 2009).

Suyama, K. et al., "Generation of Pendant Amino Groups on Irradiation of Visible Light in the Presence of Benzoquinonylsulfanyl Derivatives," J. Photopolymer Sci. & Tech. 14(5):745-48 (2001).

Suzuki, S. et al., "Pyrromethane Dye Sensitized Photopolymer and the Application to Visible Laser Direct Imaging," J. Photopolym. Sci. Technol. 117(1):125-29 (2004).

Thomes, W.J. et al., "Photobleaching Comparison of Poly(methylphenylsilylene) and Poly(phenylsilyne)," J. Appl. Phys. 96(11):6313-18 (2004).

Uchino, S. et al., "Contrast Enhancement Materials Using Water Soluble Diazonium Salts for g-Line Stepper," Polymeric Materials Sci. & Eng., Proceedings of the ACS Div. of Polymeric Materials Sci & Eng., Washington, DC 55:604-607 (1986).

Umehara, A. et al, "Application of Silicon Polymer as Positive Photosensitive Material," Society of Plastic Engineers, Inc., Photopolymers: Principles, Processes and Materials—Regional Technical Conference, Brookfield Center, CT pp. 121-31 (Oct. 30-Nov. 2, 1988).

Watanabe, H. et al., "Carbazole as Photo-Sensitizer in Photoresist," J. Photopolymer Sci. & Tech. 14(2):263-64 (2001).

West, P.R. et al., "Contrast Enhanced Photolithography: Application of Photobleaching Processes in Microlithography," J. Imaging Sci. 30(2):65-68 (1986).

International Search Report, PCT/US08/69413, dated Jan. 11, 2011.

* cited by examiner

US 8,323,866 B2

INORGANIC RESIST SENSITIZER

CROSS REFERENCE TO RELATED APPLICATIONS

The present application claims the benefit of (i) a U.S. Provisional Patent Application bearing Ser. No. 61/078,939, entitled "Inorganic Resist Sensitizer," filed on Jul. 8, 2008; and (ii) a U.S. Provisional Patent Application bearing Ser. No. 61/091,028, entitled "Inorganic Resist Sensitizer," filed on Aug. 22, 2008. Both of these provisional applications are hereby incorporated herein by reference in their entirety.

STATEMENT REGARDING FEDERALLY SPONSORED RESEARCH OR DEVELOPMENT

This invention was made with U.S. government support under DARPA/MTO contract number FA8721-05-C-0002. The government has certain rights in the invention.

FIELD OF THE APPLICATION

The present application relates to compositions and methods of their use, particularly as directed to electronics manufacturing, lithographic applications, and materials sensitive to lithographic radiation.

BACKGROUND

Manufacturing of integrated circuits has been enabled by high-performance spin-on organic polymeric resists. In addition to sensitivity and resolution requirements, resists must maintain critical linewidth control throughout the patterning process, including both imaging and subsequent transfer via processes such as plasma etch. For example, line-edge roughness on the order of 5-10 nm is a concern at 250 nm, but can render a lithographic process unworkable when critical dimensions fall to below 100 nm.

For many photolithographic techniques, a sensitivity-throughput relationship exists. In particular, increasing the sensitivity of a resist to lithographic radiation can improve process throughput by decreasing the amount of lithographic radiation needed to achieve a particular resist disposition. Thus, techniques that sensitize resists utilized at conventional electromagnetic radiation wavelengths (e.g., about 193 nm or about 157 nm) for lithography can help improve current lithographic processes.

In addition, advances in resist sensitization could enable emerging lithographic techniques for producing very small feature devices. In recent years, advanced devices have had their half-pitch at 90 nm using 193-nm dry exposures, and it is widely expected to extend to 45-nm half-pitch by incorporating liquid immersion. Indeed, according to the international roadmap for semiconductors (ITRS), this trend will continue unabated for at least one more decade with expected resolution decreasing to 45 nm in 2010, and 32 nm in 2013. Accordingly, a need exists to develop future imaging technologies such as extreme ultraviolet (EUV) lithography or maskless electron beam.

EUV lithography employs extremely small wavelength photons (13.4 nm) in imaging. It is thought that EUV will be employed to 32-nm half-pitch and possibility down to 25-nm half-pitch when finally developed. One difficulty with EUV is the lack of a high power photon source, which will limit the manufacturing throughput without the introduction of very high sensitivity resists. To get high-throughput EUV systems, the laser source must be improved to generate more of the extreme ultraviolet radiation, or light. Today's best YAG lasers generate only about 10 Watts of radiation. The power level must be boosted to 100 Watts or more for high-throughput commercial production. Even at this power level, resist sensitivity must improve significantly.

Maskless electron beam lithography has intrinsically high resolution. Its current limitation, however, is relatively low throughput. Until recently, this limitation far outweighed cost considerations of optical projection systems and photomasks. However, the balance is beginning to tilt in the other direction, both because optical lithography is becoming increasingly expensive and because novel concepts of electron-beam systems may significantly boost their throughput. Enhanced throughputs may be sufficient to enable prototyping at reduced cost and turnaround time, and even enable cost-effective production of low-volume (<1000 wafer) device runs. Nonetheless, for maskless electron-beam lithography to be successfully utilized in integrated circuit fabrication, resist sensitivity will have to be significantly increased.

Accordingly, a need exists for resist formulations and components thereof that will increase the resist sensitivity to imaging lithographic radiation. As well, it is advantageous to achieve such increases in sensitivity without substantial increases in linewidth roughness.

SUMMARY

Embodiments of the invention are directed towards compositions for performing lithographic processes, and in some instances to resist compositions. The resist compositions can enhance the sensitivity of particular resist materials such as a hydrogen-bearing siloxane material to lithographic radiation, for example through the presence of a radical generating sensitizer. Such enhanced sensitivity can increase the speed of lithographic processing (e.g., for radiation wavelengths such as 193 nm or 157 nm), while potentially maintaining high resolution during imaging. Enhanced sensitivity can also enable the use of particular advanced lithographic techniques such as EUV and electron beam. Some embodiments are directed to the resist compositions themselves, while other embodiments are directed to methods associated with the resist compositions.

For example, some exemplary embodiments are directed to methods of performing a lithographic process, which can involve increasing the sensitivity of a resist composition. A resist, which can be capable of being imaged by lithographic radiation, can be formed on a substrate, followed by applying lithographic radiation to the resist. The lithographic radiation can include any one of electromagnetic radiation, ion beams, and electron beams. For example, electromagnetic radiation can include one or more wavelengths in the range between about 0.1 nm and about 260 nm, or between about 140 nm and about 220 nm. In some instances, a developer can be contacted with the resist to remove portions of the resist after exposure to lithographic radiation. The developer can remove either the lithographically-exposed or unexposed portions of the resist, depending upon the nature of the resist composition. These methods can be used in a variety of contexts including, for example, any one or more of manufacturing an integrated circuit and/or a micro-electro-mechanical device; or producing and/or repairing a mask (e.g., transmission and/or imprint).

Resists consistent with various embodiments of the invention can include a resist material that comprises a hydrogen-bearing siloxane portion (e.g., a hydrogen silsesquioxane-based material). The resist can also include a sensitizer, such as a radical generator among other optional components, for increasing the sensitivity of the resist material to the lithographic radiation. The radical generator can be capable of forming a free radical upon exposure to the lithographic radiation. In some instances, the radical generator can include a non-basic radical generator and/or can include an alpha cleavage radical generator. The formed resist can exhibit enhanced sensitivity relative to a resist with the sensitizer removed. Such enhancement can be at least about 1%, 5%, 10%, 50%, 100%, 500%, or 1000% for example. The components of the resist can form a mixture, for example where the distribution of hydrogen-bearing siloxane material and sensitizer are substantially uniform throughout at least a portion of the resist. As well, the sensitizer can comprise less than about 50% or less than about 10% of the total weight of the resist, and/or comprise greater than about 0.1% or greater than about 1% of the total weight of the resist.

Other exemplary embodiments are drawn to kits for forming a resist material. The components of the kits, which can be packaged together or separately in individual or combinatorial components, can include any of the components of the compositions described herein, with any of the features or proportions described herein. For example, the kit can include a resist material and a sensitizer.

BRIEF DESCRIPTION OF THE DRAWINGS

The present application will be more fully understood from the following detailed description taken in conjunction with the accompanying drawings (not necessarily drawn to scale), in which.

DETAILED DESCRIPTION OF SOME EMBODIMENTS

Figure 1A:
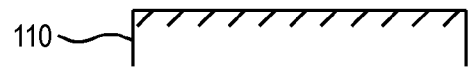
FIGS. 1A-1E depict side views of various stages of a method for utilizing a sensitizer in a resist to enhance the sensitivity of a resist to lithographic radiation, in accord with some embodiments of the invention.

Embodiments of the present invention are directed to methods and compositions for enhancing the sensitivity of a resist to lithographic radiation. In some exemplary embodiments, an amount of sensitizer material, which can be relatively small, having a radical generator can be incorporated with a resist formulation to achieve the increased sensitivity. Such embodiments can be particularly utilized in resist formulations having hydrogen-bearing siloxane portions such as hydrogen silsesquioxane (herein "HSQ") based material.

In some embodiments, the resist sensitivity of lithographic radiation can be substantially enhanced relative to the sensitivity of the same resist without the presence of the sensitizer material. Such increases in sensitivity can be greater than about 1% to about 5000% or higher. In addition, some embodiments are directed to compositions and methods providing resist sensitivity at wavelengths where the resist would not normally be sensitive without the use of the sensitizers described in the present application, thereby enabling the use of HSQ based resists, for example, in semiconductor fabrication and mask making. Some embodiments are particularly directed for use with optical lithography at any number of wavelengths. In some instances, the lithographic radiation used to perform optical lithography can be characterized by at least one wavelength of radiation, for example a wavelength in a range where the lower limit is any of about 0.1 nm, 120 nm, and 140 nm; and the upper limit is any of about 200 nm, 220 nm, and 260 nm. In other embodiments, the use of the disclosed sensitizer can appreciably increase the sensitivity of a resist to particular lithographic radiation (e.g., about 157 nm), or can enable use of an inorganic resist that has no appreciable sensitivity, and thus is not currently used, at a selected wavelength (e.g., about 193 nm and/or about 248 nm). In addition, some embodiments are also valuable for EUV and electron beam lithography where resist sensitivity drives process throughput due to the inability of EUV and electron beam sources to deliver sufficient energy to the wafer. Accordingly, some embodiments potentially provide a significant and valuable contribution to semiconductor manufacturing.

As used herein, the term "sensitivity" in the context of resist susceptibility to lithographic radiation refers to the minimum intensity/area of lithographic energy applied to a resist composition that results in a selected state of imaging of the resist composition. Accordingly, a resist that is more "sensitive" requires less intensity in lithographic radiation to achieve the selected state. The selected state can be defined in a variety of manners. For instance, the selected state can be a selected level of remainder of a negative resist composition upon exposure to the applied lithographic energy. For example, one measure of sensitivity is equivalent to the $E_{N50}$ dose, as described in the Experimental Section herein.

Without necessarily being limited by any particular theory, it is believed that the sensitizer can act in some instances to catalyze crosslinking of a resist. Some embodiments potentially improve resist sensitivity by increasing the absorbance of a resist to lithographic radiation (e.g., photons, electrons, and/or ions) exposure. In some instances, the presence of a sensitizer in a resist composition can act to generate radicals when the composition is exposed to lithographic radiation (e.g., actinic radiation such as about 248 nm, about 193 nm, about 157 nm, EUV, x-rays; and/or electrons). That radical then acts to accelerate crosslinking in the resist material (e.g., HSQ-based material) beyond what would occur when the resist sans the sensitizer would be exposed to equivalent lithographic radiation. The increased rate of radical formation, which results in an increased extent of crosslinking, directly increases resist sensitivity and manufacturing throughput.

In conventional lithographic techniques, a sensitivity-resolution tradeoff exists when attempting to etch small features. For various lithographic processes, such as EUV, maskless electron beam, and some optical lithographic techniques, throughput can be limited by the amount of photons or electrons available with appropriate energies. Accordingly, an increase in resist sensitivity can directly translate into increased manufacturing throughput and lower per wafer manufacturing cost. The increase in resist sensitivity can relate almost directly in a 1:1 fashion with an increase in semiconductor wafer throughput. Wafer throughput is one of the most significant drivers in predicting lithography cost of ownership and thus directly impacts semiconductor manufacturing cost.

This can be seen in the following basic equation, which can be employed to estimate lithography cost of ownership (CoO).

$$CoO=(F\$+O\$+Y\$)/(L*TPT*Y*U)$$

where CoO is the cost per good wafer out; F$ is fixed costs; O$ is variable cost (operating cost); Y$ is cost due to yield loss; L is the life of the tool; TPT is throughput; Y is composite yield; U is utilization. Fixed costs include purchase, installation and facilities costs that are normally amortized over the life of the equipment. Variable costs such as material, labor, maintenance, utilities and overhead expenses are incurred during equipment operation. Throughput is based on the time to meet a process requirement such as pattern imaging. Composite yield may include breakage, misprocessing, defects and process control scrap losses. Utilization is the ratio of production time compared with total available time. Yield loss cost is a measure of the accumulated manufacturing cost of wafers lost through operational losses and probe yield issues. Yield models are used in CoO calculations for estimating the relationship between contamination and yield loss or scrap. This model relates IC yield to circuit and process parameters such as device geometry, particle density and defect clustering.

It can be readily seen that any increase in throughput will directly result in lower cost of ownership. Accordingly, some embodiments described herein can result in a substantial economic saving for producers of particular devices using lithographic techniques because of the increased sensitivity of the resist.

Methods for Enhancing Resist Sensitivity

One exemplary embodiment is depicted in FIGS. 1A-1E, showing stages in a method for enhancing the sensitivity of a resist in the context of etching a semiconductor substrate. As depicted in FIG. 1A, a surface of a substrate 110, such as a silicon wafer, is prepared for processing. Preparation can include particular cleaning, rinsing, drying, and/or other surface treatments such as adding a surface composition to adjust interfacial properties between the substrate and a resist composition. The term "substrate" refers to a material body having a surface typically suitable for application of a composition thereon. In many instances, a substrate can be a portion of an electronic device in which a layer may be deposited thereon, and/or lithographic processes can be conducted therewith. For example, a substrate can be a wafer (e.g., single crystal, polycrystalline, amorphous, etc.) comprising silicon, germanium, gallium arsenide, or other materials including those typically utilized in electronics manufacturing.

Figure 1B:
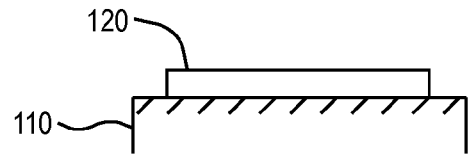

Next, a resist 120 is formed as a layer on the substrate 110 as shown in FIG. 1B. Resists are typically susceptible to change when exposed to a selected lithographic radiation (e.g., the resist is imaged by a pattern of lithographic radiation projected on the surface of the resist). In many instances, the resist includes a matrix material and a sensitizer for increasing the sensitivity of the resist to lithographic radiation. A description of some potential matrix materials and sensitizers of a resist composition are described herein, and can be applied in any appropriate combination or manner to practice various embodiments as described herein. For example, the resist composition can include a material having hydrogen-bearing siloxane portion (e.g., a HSQ-based material), which can undergo a change in developer solubility when exposed to a selected level of lithographic radiation; and a sensitizer (e.g., a radical generator) for increasing the sensitivity of the resist composition to lithographic radiation. Resists can also include a variety of other components, including those typically utilized by a skilled artisan (e.g., an antireflective coating).

Formation of the resist layer can be performed using any number of techniques, including those known to one skilled in the art. In some instances, spin casting techniques can be applied to deposit the resist composition, resulting in a selected resist thickness (e.g., between about 50 nm and 500 nm). In some embodiments, a post-apply bake (herein "PAB") is performed after the resist is applied to a substrate. A PAB step can act to remove residual solvent in the resist formulation and/or reduce stress in the layer formed. Such a step can be performed by subjecting the substrate and resist layer to a heating apparatus or using any other suitable technique, including those known to one skilled in the art. Types of heating devices include the use of ovens (e.g., air convection, conduction, or infrared), hot plates, and tracks systems. In some instances, not incorporating a PAB step can act to increase the sensitivity of a resist composition to lithographic radiation relative to using a PAB step.

Some embodiments can add one or more layers on top of the resist 120 and/or located between the resist 120 and the substrate 110. Such additional layers can provide additional features. For example, one or more layers can be disposed on top of the resist 120 to act as a barrier layer to inhibit or prevent contact of substances with the resist 120. For example when liquid immersion lithography is being utilized, the barrier layer can inhibit or prevent resist from solubilizing and intermingling with the liquid, which can potentially contaminate the liquid (thereby changing its optical properties) and/or the lens of the radiation source. Other layers can also act to provide additional features such as changing the optical nature of lithographic radiation incident on the resist, or acting as an adhesion layer, or acting as an antireflective coating.

Figure 1C:
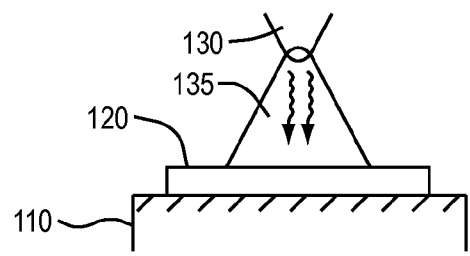

The resist 120 can be imaged by applying lithographic radiation 135 from a source 130 as exemplified in FIG. 1C. The terms "imaging" and "image," as applied to a resist, refer to the process of applying, and the form of, respectively, a selected pattern on the resist by interaction of the resist with lithographic radiation. The phrase "lithographic radiation" refers to the energy medium used to impart a pattern upon a resist composition. In many instances, lithographic radiation can be embodied as electromagnetic radiation of a certain wavelength, or wavelength range, and can be further characterized by a dose (e.g., energy/area) or energy flux. Though any wavelength or wavelength range suitable for imaging a resist composition can be utilized, in some embodiments that utilize a sensitizer the wavelength can be in a range from about 0.1 nm to about 250 nm; or in a range from about 0.1 nm to about 220 nm. In some embodiments, the electromagnetic radiation has a wavelength corresponding to about 248 nm, about 193 nm, about 157 nm, the EUV (e.g., about 10 nm to about 20 nm), and/or X-rays (e.g., about 0.1 nm to about 10 nm). In particular embodiments, the electromagnetic radiation is about 193 nm or about 157 nm. Higher wavelengths, for example above 250 nm such as 365 nm, can also be used. Lithography utilizing electromagnetic radiation (e.g., at about 193 nm and/or about 157 nm) can be performed in "dry" or "wet" environments. In some embodiments, lithographic radiation can also be embodied by electron beams and/or ion beams. For instance, aspects of the present invention can be useful in maskless electron beam lithography.

Lithographic radiation sources for use with some embodiments can include any sources appropriate for generating desired lithographic radiation for selected pattern formation. Such sources can utilize a variety of hardware, including those known to a skilled artisan for producing a desired type of lithographic radiation. For example, krypton fluoride excimer lasers can provide light at about 248 nm, argon fluoride excimer lasers can provide light at about 193 nm, and molecular fluorine excimer lasers can provide light at about 157 nm. Other embodiments can utilize broadband sources or sources that generate a variety of energies and/or wavelengths, which can be followed by the use of a filter to select desired wavelengths or energies.

A selected pattern of lithographic radiation can be any desired geometrical shape, and is typically two-dimensional in character. Processes for imaging a resist include any process capable of delivering the lithographic radiation in a manner suitable for proper image formation. In some instances, the lithographic radiation is applied by exposing the resist to a pattern of lithographic radiation that is similar to the selected pattern for the resist. For example, a mask can be located between the lithographic radiation source and the resist surface. The mask can have regions that preferably allow lithographic radiation penetration, inducing a radiation image on the surface of the resist. In another example, a maskless aerial image pattern is directly projected onto the resist surface, such as utilized in photolithography and/or electron beam lithography. In other instances, the lithographic radiation is applied by scanning the resist, by either moving the target or radiation source or both. Any of these techniques among others, including those known to one skilled in the art, can be utilized to form the selected pattern.

Exposure of a resist composition to lithographic radiation can result in resist imaging by a variety of mechanisms. For example, the portion of a resist exposed to lithographic radiation can result in crosslinking of the matrix material (e.g., crosslinking of a material having a hydrogen-bearing siloxane portion). Accordingly, the exposure can make the resist material more insoluble upon contact with a developer (e.g., relative to when the material is not exposed to lithographic radiation). Thus, development of a post-exposed resist can result in a pattern transfer to the resist. In some instances, the environment in which lithographic radiation occurs can contribute to the imaging performance. Accordingly, some embodiments perform exposure in an environment that includes fluids that do not interact with the lithographic process (e.g., using gases including any one or more of nitrogen and an inert gas). Other embodiments utilize an environment substantially free of oxygen. Still other embodiments perform lithography in the presence of oxygen (e.g., in air).

In some embodiments, the presence of a sensitizer in the resist composition can enhance the sensitivity of the composition to a selected lithographic radiation condition. For instance, the sensitizer can increase the sensitivity of the resist by at least 1%, 5%, 10%, 25%, 50%, 75%, 100%, 200%, 300%, 400%, 500%, 1000%, 2000%, 3000%, 4000%, 5000% or more relative to the resist composition sans the sensitizer. In some instances, the sensitivity of the resist can depend upon the nature of the lithographic radiation to which the resist is exposed. For example, the resist sensitivity can be increased by about 10 to about 50 times with a 193-nm exposure and/or about 1.5 to about 3.0 times with a 157-nm exposure.

Such sensitivity enhancements can surprisingly allow the use of particular resist materials (e.g., materials having a hydrogen-bearing siloxane portion) that would otherwise not be practical for lithographic use, or improve the sensitivity of the resist, which can be surprisingly dramatic in some instances (e.g., increased sensitivity of over 50%). For example, some sensitizers discussed herein can increase the sensitivity of resists having HSQ-based matrix material at particular lithographic wavelengths, e.g., 248- and/or 193-nm, where HSQ is not typically considered a resist due to the complete lack of sensitivity of HSQ. The greatly increased sensitivity make the sensitized-HSQ resist a candidate for use as a manufacturing resist.

Without being bound by any particular theory, the enhancement in sensitivity in the resist may be achieved by improving photon and/or electron transfer in the resist, which can accelerate matrix material crosslinking. Such transfer improvement may be achieved by the production of radicals with a high quantum yield, which may accelerate acid generator production of acid.

One or more types of post-exposure treatments can be performed to aid imaging of the resist subsequent to application of the lithographic radiation. For instance, a post-exposure bake (herein "PEB") can be performed on the resist. A PEB can serve one or more functions such as to facilitate progression or termination of a lithographically-induced chemical reaction in the resist. The PEB can be performed using heating equipment, such as described with respect to PAB herein. Other types of post-exposure treatments include radiation exposure, vacuum exposure, and reactive gas exposure.

Figure 1D:
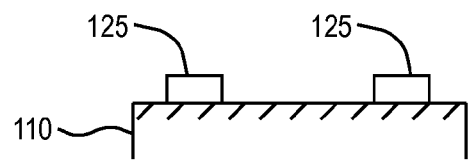
Figure 1E:
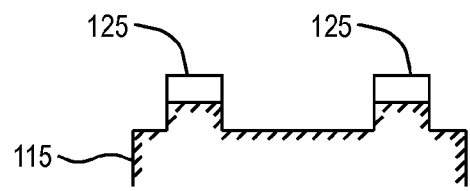

As depicted in FIG. 1D, portions of the resist can be removed to reveal a pattern 125 after completion of resist exposure to lithographic radiation. Removal can be effected by a variety of techniques such as contacting the resist with an appropriate solvent and/or other developer, depending upon the nature of the resist composition. After removal of the exposed resist areas, lithographic step(s) for etching exposed portions of the substrate 110 can be performed to create desired features on the substrate 110 as depicted in FIG. 1E. Such lithographic steps are well understood by those skilled in the art.

Figure 2:
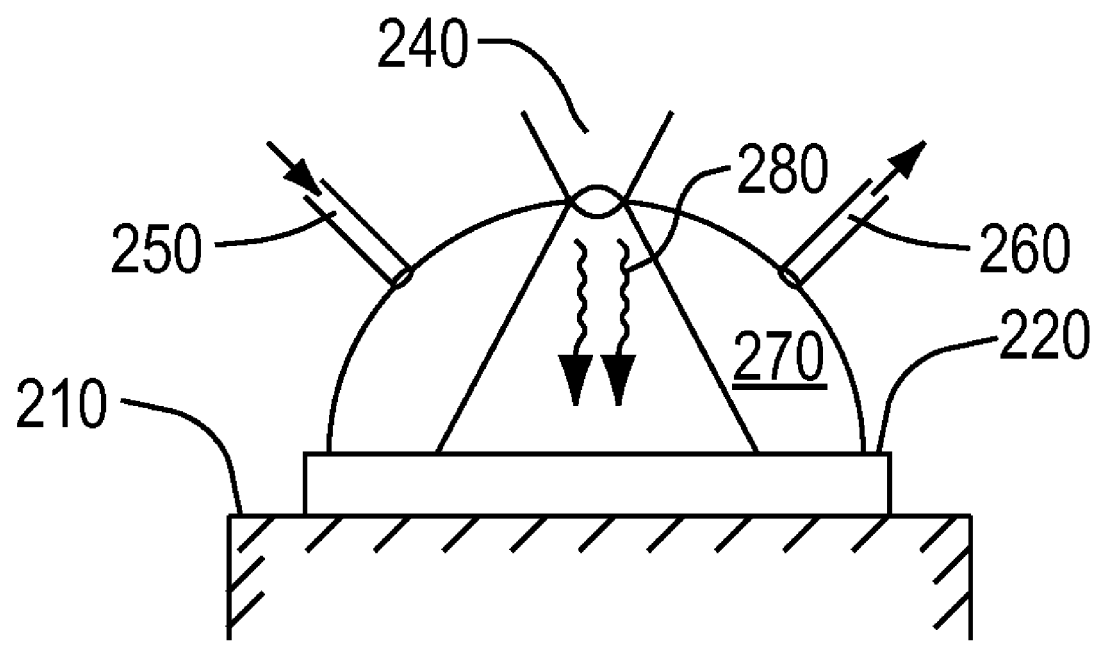
FIG. 2 depicts a side view of a liquid immersion lithography step, in accord with some embodiments of the invention.

Some embodiments are directed to techniques utilizing liquid immersion lithography with one or more aspects of the present invention. As depicted in FIG. 2, a substrate 210 has a resist layer 220 formed thereon. Formation of the resist, which can include a sensitizer, and any other optional layers can be performed in accordance with appropriates steps as discussed herein. A liquid layer 270 can contact a portion of the resist surface 220 (e.g., about 5 $cm^2$ to about 10 $cm^2$) and the radiation source 240. The liquid can be distributed through a outlet port 250 and sucked into an inlet port 260 as depicted in FIG. 2, though other ways of forming and maintaining the liquid layer can also be utilized as understood by those skilled in the art. A pattern can be applied to the resist, e.g., an image projected through the liquid layer 270 and onto the surface of the resist 220 using actinic radiation 280 as shown in FIG. 2. Subsequently, the liquid 270 can be removed, with the exposed sections of the resist also being removed using techniques discussed herein and known to those skilled in the art.

The use of the liquid layer can act to increase the line width resolution achieved by a particular actinic radiation wavelength relative to "dry" lithography. For example, when implemented at about 193 nm, liquid immersion lithography could provide similar resolution as "dry" 157 nm. In dry lithography, the largest numerical aperture (NA) possible is 1.0, which is defined in part by the refractive index of air being 1.0. In liquid immersion lithography, a fluid is introduced between the last optical element and the photoresist. Thus, the NA of the projection optics is effectively increased to above 1.0. For example, the 193 nm refractive index of high-purity water is ~1.44, and this is therefore the upper limit of the NA using water at 193 nm. Viewed another way, the vacuum wavelength of 193 nm is reduced by the refractive index of water to an effective wavelength of 134 nm in the image plane. This value is less than 157 nm, implying that a higher resolution is possible with 193 nm and water immersion than with dry 157 nm. A similar reduction in effective wavelength could be possible employing an liquid immersion lithographic system at 157 nm.

Some embodiments related to lithography of sensitized resists can yield high resolution imaging, which can be used for a variety of applications. For example, the imaging can be used in the manufacturing of integrated circuits. Imaging can also be employed for the production of photomasks used in the manufacturing of integrated circuits, and also for the repair of masks employed in the manufacturing of integrated circuits (e.g., by adding masking material to areas of the mask).

In one example, some embodiments can be used for the repair of phase shift photomasks where the addition of masking material of the proper refractive index and thickness is currently not possible. The repair of masks, particularly phase shift masks, is one of the most difficult steps in the semiconductor industry. There is currently no known process for the additive repair of phase shift masks, and this lack of capability in this area is responsible for over half of the cost of phase shift masks as often several masks are prepared to produce an acceptable unit. The ability to repair phase shift masks would reduce mask cost significantly in the semiconductor industry.

Another potential use of imaging, consistent with some embodiments, is the production of imprint masks for the manufacturing of integrated circuits where an additive process can be used to produce the imprint mask, thereby reducing mask manufacturing steps and cost. An additive process for the production of imprint mask is currently not possible. Imaging can also be potentially used for the repair of imprint masks where the addition of masking material is used to correct defects in required structures. Some embodiments can also be used for the production or additive repair of micro-electro-mechanical devices where an additive process can be employed to make a structure with high silicon dioxide content. Some embodiments can be used for double exposure or double patterning, where a second resist can be coated over the crosslinked and insoluble HSQ from the first exposure.

Sensitizer and Resist Related Compositions

Some embodiments are directed to resist compositions that exhibit enhanced sensitivity to lithographic radiation. Such compositions can include a resist material that includes a material having a hydrogen-bearing siloxane portion such as a hydrogen silsesquioxane-based material. A sensitizer can be included with the composition, where the sensitizer acts to increase the sensitivity of the resist composition to lithographic radiation vis-à-vis the composition sans the sensitizer. For instance, the sensitizer can include a radical generator, which can be capable of forming one or more free radicals upon exposure to lithographic radiation. The sensitizer and the resist material can be mixed together (e.g., substantially uniformly distributed together).

A material having a hydrogen-bearing siloxane portion includes materials where at least a portion of the composition includes molecules that have at least one section with an oxygen atom bonded to two silicon atoms, where each silicon atom is bonded to at least one hydrogen atom. In some embodiments, the molecules can be either oligomers or polymers—though the material can include any number of these types of molecules and optionally other components. One exemplary material is a hydrogen silsesquioxane-based (herein "HSQ-based") material. HSQ is formed from one or more connected oligomers formed from caged silsesquioxane molecules, in which the caged units can be arranged linearly. Accordingly, an HSQ-based material include oligomers of caged silsesquioxane, or other caged siloxane structures with hydrogen termination, where the oligomers are connected in any feasible geometry. Crosslinking of the HSQ can typically be achieved with temperatures above 400° C. where the curing reaction proceeds through conversion of Si—H bonds to form Si—OH groups. These silanols are unstable and rapidly degrade to form siloxane bonds (Si—O—Si) whereby the oligomers can coalesce into a network.

HSQ can be used as a low dielectric constant spin on glass for isolation of metal lines in the back end of line processing. HSQ has also been employed as a high resolution negative tone electron beam resist. A similar reaction occurs upon electron beam irradiation where the silicon hydride (Si—H) bonds are scissioned to form silanols (Si—OH) in the presence of absorbed moisture within the film. These silanol functionalities further decompose rapidly to form siloxane (Si—O—Si) bonds which render the exposed regions of the HSQ film insoluble in aqueous base or organic solvents. This resist process has been applied in single and bilayer lithography schemes for various applications with a demonstrated resolution of 20 nm. Due to its high etch resistance in an oxygen plasma, HSQ has also been utilized in a bilayer lithography process with a hard baked novolac planarizing layer. Using this bilayer approach, aspect ratios on the order of 30:1 have been demonstrated after pattern transfer through the underlayer.

Although HSQ resists have demonstrated very high resolution, a major drawback is the high dose required to cause network formation. For example, with electron beam imaging, a 100 nm thick film exposed at 100 keV required a dose of approximately 1500 $\mu C/cm^2$ to produce an image. In comparison, typical chemically amplified resists (CARs) can be imaged with an order of magnitude lower dose in the range of approximately 100-200 $\mu C/cm^2$ for similar exposure conditions.

To reduce the exposure dose required to image on HSQ, and to make it comparable to that of CARs, additives have been added to HSQ. Photobase generator (PBG) was used to catalyze network formation to optically pattern HSQ at 254-nm wavelength. It was shown that increasing the PBG loading in an HSQ-PBG mixture enhanced the optical sensitivity of HSQ. This approach takes advantage of the rapid conversion of the silicon hydride (Si—H) group to a silanol (Si—OH) in the presence of absorbed moisture and a base catalyst. The photobase generators used possessed large absorbance in the 254-nm region which made optical patterning possible with imaging doses between 2 and 20 $mJ/cm^2$.

Imaging is also possible at the 157 nm exposure wavelength without employing sensitizing additives into the resist. Exposure doses vary between 20 and 200 $mJ/cm^2$ depending on the processing conditions. The more sensitive resist processes, however, employ relatively high levels of oxygen in the environmental gas mixture to presumably act as a source of free radicals and thus catalyze HSQ crosslinking. The high levels of oxygen, however, are highly absorbing at 157 nm and act to attenuate the exposure source and reduce the dosage reaching the resist surface. A second problem is that gaseous generated radicals can highly diffuse, leading to significant reduction in imaging resolution and an impervious surface film preventing imaging development. The best imaging reported was with doses of between 500 and 1000 $mJ/cm^2$.

Some embodiments utilize a resist composition that can enhance the sensitivity of a material with a hydrogen-bearing siloxane portion to exposure to lithographic radiation by the presence in the resist of a sensitizer that includes a radical generator. The presence of the sensitizer in a resist composition can increase the sensitivity by at least about 1%, 5%, 10%, 25%, 50%, 75%, 100%, 200%, 300%, 400%, 500%, 1000%, 2000%, 3000%, 4000%, 5000% or more relative to the composition sans the sensitizer. The radical generator can be a portion of the resist, as opposed to, for example, a gas outside the resist, and can be mixed intimately with the other portions of the resist.

Radical generators generally include any number of known materials that form free radicals upon exposure to selected lithographic radiation, such as photoinitiators. Radical generators exclude photobase generators. In some embodiments, radical generators can include a non-basic radical generator (i.e., the radical generator is not itself a base, nor transforms into a base upon activation, for example by lithographic radiation exposure). In some embodiments, radical generators can include hydrogen abstraction radical generators, alpha cleavage radical generators, or both of these. The alpha cleavage radical generators have a generally higher efficiency due to their generation of free radicals via a unimolecular process. In some embodiments, the unimolecular process involves the cleavage of a carbon-carbon bond alpha to a carbonyl moiety to generate a radical pair. Other embodiments involving unimolecular processes can utilize a different mechanism. The alpha cleavage radical generators need only to absorb light or electrons in order to generate radicals. The higher efficiency makes alpha cleavage radical generators a preferred, though not necessarily exclusive, type for use as a sensitizer. Hydrogen abstraction radical generators can require an extra step in that after absorbing light; the excited state radical generator must find a hydrogen donating source in order to generate free radicals via a bimolecular process.

Some examples of radical generators include photoinitiators supplied by Ciba such as Irgacure 184, Irgacure 261, Irgacure 369, Irgacure 379, Irgacure 500, Irgacure 651, Irgacure 727, Irgacure 750, Irgacure 784, Irgacure 819, Irgacure 907, Irgacure 1035, Irgacure 1700, Irgacure 1800, Irgacure 2959, Irgacure OXE01, Darocur 1173, Darocur 4265, Darocur TPO, Darocur BP, CGI 1905, and CGI 263. In some embodiments, radical generators with enhanced absorbance of a selected lithographic radiation type can be used to provide enhanced sensitivity to a resist composition (e.g., at about 248 nm).

In some embodiments in which a resist composition includes a sensitizer, the sensitizer can constitute a small fraction of the total amount (e.g., weight) of the total resist weight. For instance, the sensitizer can be less than about 50%, 40%, 30%, 20%, 10%, 5%, 3%, or 1% of the total weight of the resist composition. In other instances, the sensitizer can constitute a percentage between about 0.01%, 0.1%, 0.5%, 1% and any of the previously recited values of the entire weight of the resist (e.g., between about 1% and about 10%).

Resist compositions can be applied to form a resist layer on a substrate. Accordingly, in some embodiments, the resist composition is formulated as a layer on a substrate having a selected thickness appropriate for performing a particular lithographic step. In some embodiments, the resist layer has a thickness less than about 1000 nm, 500 nm, 400 nm, 300 nm, 200 nm or 100 nm.

In other embodiments, a resist composition can be selected such that the resist exhibits additional, or alternative, properties. Other compositions can also be added to provide one or more of the properties discussed herein. In some embodiments, a resist composition can include a material to enhance the film forming properties of the resist (e.g., quicker drying times, striation-free film formation, and/or suppression of cross-linking). Film-forming polymers can be used with any of the resist compositions discussed within the present application to enhance film formation of the resist.

Compositions consistent with embodiments of the present invention can also include a variety of other components that provide additional features. Solvents and other components (e.g., viscosity control agents or surfactants) are optionally included to provide properties such as facilitating spin-coating and/or film formation in a resist. In some embodiments, one or more components can be added to a resist to increase the oxygen content of the composition relative to not having the components therein.

Other embodiments of the present invention are directed to kits for forming a composition, which can potentially be used in lithographic processes. In some embodiments, the kit includes one or more of the components of a resist composition as described in the present application. The components of the kit can include any combination of the potential parts of a resist composition, in any of the dispositions discussed herein. As well, a kit can package the components in any potential of combinations. Accordingly, a kit can package the components separately, or can combine any number of the components into units, or combine all components into a single unit.

For instance, some exemplary embodiments are drawn to kits that can be used to formulate a resist composition. The kit can include a resist material including a material having a hydrogen-bearing siloxane portion such as a HSQ-based material. A sensitizer can also be included for increasing the sensitivity of the resist composition/material, which can include a radical generator. Any other types of sensitizers and/or resist materials can be utilized as disclosed in the present application. As well, the proportions of the composition components can be any that can result in a workable resist for a lithographic application, including those discussed herein.

EXAMPLES

The following examples are provided to illustrate some embodiments of the invention. The examples are not intended to limit the scope of any particular embodiment(s) utilized.

EXPERIMENTAL DESCRIPTION

Resist Materials

Hydrogen silsesquioxane (HSQ) was obtained from the Dow Corning Corporation under the trade name of FOx® Flowable Oxide (FOx®-16) and was composed of 22 parts hydrogen silsesquioxane (HSQ) dissolved in 78 parts methyl isobutyl ketone. Irgacure 184 (1-Hydroxy-cyclohexyl-phenyl-ketone), Irgacure 369 (2-Benzyl-2-dimethylamino-1-(4-morpholinophenyl)-butanone-1), Irgacure 651 (2,2-dimethoxy-2-phenylacetophenone), Irgacure 819 (bis(2,4,6-trimethylbenzoyl)-phenylphosphineoxide), Irgacure 2959 (1-[4-(2-Hydroxyethoxy)-phenyl]-2-hydroxy-2-methyl-1-propane-1-one), Darocur 1173 (2-Hydroxy-2-methyl-1-phenyl-propan-1-one) and Darocur TPO (2,4,6-Trimethylbenzoyl-diphenyl-phosphineoxide) were obtained from Ciba Specialty Chemicals. AR3 antireflectant coating was obtained from Rohm and Haas. Methyl isobutyl ketone (4-methyl-2-pentanone) was purchased from Aldrich Chemical.

General Lithography Process Conditions

Film spin-casting and the post apply bake (PAB) were performed on a GCA Corporation Wafertrac 1006®. Development was accomplished by static immersion in Rohm & Haas LDD-26W, a commercial resist developer. The negative dose ($E_{N50}$) is the lowest exposure dose at which 50% normalized film thickness resist remains after development. It was determined by fitting a line through all points containing between 20% and 80% normalized film thickness as a function of dose and determining the intercept for 50% remaining film thickness. If there was no dose in which at least 50% retained thickness occurred, the $E_{N50}$ was not determined, and instead the $E_{N50}$ is given as being greater than the maximum exposure dose employed. The contrast ($\gamma$) was determined by fitting a line through all points containing between 20% and 80% normalized film thickness remaining as a function of the log of dose and determining the absolute value of the slope. The energy of onset of negative behavior ($E_{ONB}$) is the lowest dose at which any resist remains after development. Contrast curves at either 157-nm, 193-nm, or 248-nm were performed on a laboratory-class projection system employing a $F_2$, ArF or KrF excimer laser. Film thickness measurements were made on a Gaertner Scientific Corporation L115BLC Dual Wavelength Ellipsometer.

Example 1

Preparation of HSQ Based Negative Resist

The resists were prepared by adding methyl isobutyl ketone, a 22% HSQ solution in methyl isobutyl ketone, and a radical generator sensitizer in the amounts listed below to make an approximately 10.0% weight of solids to total weight solution. The solution was rolled over night and filtered through a 0.2 μm filter.

| Resist | Parts Sensitizer | Sensitizer | Parts 22% HSQ | Parts MIBK |
|---|---|---|---|---|
| 23000 | 0 | none | 454 | 546 |
| 23014 | 1 | Irgacure I-184 | 450 | 549 |
| 23015 | 3 | Irgacure I-184 | 441 | 556 |
| 23016 | 1 | Irgacure I-819 | 450 | 549 |
| 23017 | 3 | Irgacure I-819 | 441 | 556 |
| 23020 | 1 | Irgacure I-651 | 450 | 549 |
| 23021 | 3 | Irgacure I-651 | 441 | 556 |
| 23022 | 6 | Irgacure I-819 | 427 | 567 |
| 23023 | 9 | Irgacure I-819 | 414 | 577 |
| 23029 | 6 | Irgacure I-2959 | 427 | 567 |
| 23030 | 6 | Darocur TPO | 427 | 567 |
| 23031 | 3 | Irgacure I-2959 | 441 | 556 |
| 23032 | 3 | Darocur TPO | 441 | 556 |

Example 2

Comparison of HSQ Based Resists with No PAB at 157-nm in Nitrogen

Resists 23000, 23014, 23015, 23016, 23017, 23020, and 23021 were coated to 250-nm on 120-nm AR3 on a silicon wafer, with no PAB, exposed at 157-nm in nitrogen, and developed for 150 s with LDD-26W. Results are given in Table 1.

TABLE 1

Lithographic performance with no PAB with 157-nm exposure in nitrogen.

| Resist | Parts Sensitizer | Sensitizer | $E_{N50}$ (mJ/cm$^2$) | Contrast (γ) | $E_{ONB}$ (mJ/cm$^2$) |
|---|---|---|---|---|---|
| 23000 | 0 | none | 692 | 2.6 | 400 |
| 23014 | 1 | Irgacure I-184 | 343 | 2.1 | 200 |
| 23015 | 3 | Irgacure I-184 | 275 | 2.3 | 191 |
| 23016 | 1 | Irgacure I-819 | 296 | 1.9 | 175 |
| 23017 | 3 | Irgacure I-819 | 216 | 1.8 | 140 |
| 23020 | 1 | Irgacure I-651 | 506 | 1.8 | 300 |
| 23021 | 3 | Irgacure I-651 | 424 | 2.2 | 300 |

The example shows that the sensitivity of the resist containing the radical generator sensitizer in amounts from 1% to 3% is from 1.4 to 3.2 times greater than the resist that does not contain the radical generators. The sensitization is most pronounced when comparing the $E_{N50}$ of resist 23000 which is 692 mJ/cm$^2$ to that of resist 23017 where it is 216 mJ/cm$^2$. This shows that the radical generators act to significantly increase the sensitivity of the resist with no PAB with 157-nm exposure in nitrogen. The results show that the contrast is high for all resists and all resists are thus capable of being used as high resolution resists.

Example 3

Comparison of HSQ Based Resists with 125° C. PAB at 157-nm in Nitrogen

Resists 23000, 23016, 23017, 23022, and 23023 were coated to 250-nm on 120-nm AR3 on a silicon wafer, PAB baked at 125° C. for 60 s, exposed at 157-nm in nitrogen, and developed for 150 s with LDD-26W. Results are given in Table 2.

TABLE 2

Lithographic performance with 125° C. PAB with 157-nm exposure in nitrogen.

| Resist | Parts Sensitizer | Sensitizer | $E_{N50}$ (mJ/cm$^2$) | Contrast (γ) | $E_{ONB}$ (mJ/cm$^2$) |
|---|---|---|---|---|---|
| 23000 | 0 | none | 829 | 9.1 | 665 |
| 23016 | 1 | Irgacure I-819 | 601 | 2.1 | 348 |
| 23017 | 3 | Irgacure I-819 | 444 | 1.7 | 279 |
| 23022 | 6 | Irgacure I-819 | 372 | 2.4 | 262 |
| 23023 | 9 | Irgacure I-819 | 322 | 3.0 | 235 |

The example shows that the sensitivity of the resist containing the radical generator sensitizer in amounts from 1% to 9% is from 1.4 to 2.6 times greater than the resist that does not contain the radical generator. The sensitization is most pronounced when comparing the $E_{N50}$ of resist 23000 which is 829 mJ/cm$^2$ to that of resist 23023 where it is 322 mJ/cm$^2$. This shows that the radical generator acts to significantly increase the sensitivity of the resist with a 125° C. PAB and with 157-nm exposure in nitrogen. The results show that the contrast is high for all resists and all resists are thus capable of being used as high resolution resists.

Example 4

Comparison of HSQ Based Resists with 125° C. PAB at 157-nm in 1000 ppm Oxygen

Resists 23000, 23016, 23017, 23022, and 23023 were coated to 250-nm on 120-nm AR3 on a silicon wafer, PAB baked at 125° C. for 60 s, exposed at 157-nm in nitrogen with 1000 ppm oxygen, and developed for 150 s with LDD-26W. Results are given in Table 3.

TABLE 3

Lithographic performance with 157-nm exposure in 1000 ppm oxygen.

| Resist | Parts Sensitizer | Sensitizer | $E_{N50}$ (mJ/cm$^2$) | Contrast (γ) | $E_{ONB}$ (mJ/cm$^2$) |
|---|---|---|---|---|---|
| 23000 | 0 | none | 189 | 12.6 | 172 |
| 23016 | 1 | Irgacure I-819 | 126 | 14.3 | 117 |
| 23017 | 3 | Irgacure I-819 | 134 | 13.5 | 123 |
| 23022 | 6 | Irgacure I-819 | 229 | 8.5 | 200 |
| 23023 | 9 | Irgacure I-819 | 329 | 12.1 | 299 |

The example shows that the sensitivity of the resist containing the radical generator sensitizer in amounts from 1% to 3% is from 1.4 to 1.5 times greater than the resist that does not contain the radical generator. The sensitization is most pronounced when comparing the $E_{N50}$ of resist 23000 which is 189 mJ/cm$^2$ to that of resist 23016 where it is 126 mJ/cm$^2$. At higher levels, the radical generator decreases sensitivity. The use of oxygen to increase resist sensitivity with 157-nm exposure has been shown to significantly reduce resolution due to the formation of an insoluble surface film preventing imaging development. The results show that the contrast is high for all resists and all resists are thus capable of being used as high resolution resists.

Example 5

Comparison of HSQ Based Resist with No PAB at 193-nm in Nitrogen

Resists 23000, 23014, 23015, 23016, 23017, 23020, 23021, 23029, 23030, 23031, and 23032 were coated to 250-nm on 140-nm AR3 on a silicon wafer, with no PAB, exposed at 193-nm in nitrogen, and developed for 150 s with LDD-26W. Results are given in Table 4.

TABLE 4

Lithographic performance with no PAB with 193-nm exposure in nitrogen.

| Resist | Parts Sensitizer | Sensitizer | $E_{N50}$ (mJ/cm$^2$) | Contrast ($\gamma$) | $E_{ONB}$ (mJ/cm$^2$) |
|---|---|---|---|---|---|
| 23000 | 0 | none | >50000 | na | 50000 |
| 23014 | 1 | Irgacure I-184 | >4800 | na | 2200 |
| 23015 | 3 | Irgacure I-184 | 1130 | 1.0 | 586 |
| 23016 | 1 | Irgacure I-819 | >4800 | na | 2600 |
| 23017 | 3 | Irgacure I-819 | 2169 | 2.6 | 1435 |
| 23020 | 1 | Irgacure I-651 | 2838 | 1.0 | 1300 |
| 23021 | 3 | Irgacure I-651 | 952 | 1.3 | 595 |
| 23031 | 3 | Irgacure I-2959 | 3736 | 0.7 | 1420 |
| 23029 | 6 | Irgacure I-2959 | 2510 | 1.4 | 1300 |
| 23032 | 3 | Darocur TPO | 1952 | 1.5 | 1238 |
| 23030 | 6 | Darocur TPO | 1420 | 3.0 | 1100 |

The HSQ without sensitizer does not have a measurable $E_{N50}$ with exposure doses up to 50 J/cm$^2$ while the sensitized HSQ resists exhibit measurable $E_{N50}$ doses from 900 to 3800 mJ/cm$^2$. The example shows that the sensitivity of the resists containing the radical generator sensitizers in amounts from 1% to 6% is at least 13 to 52 times greater than the resist that does not contain the radical generators. The sensitization is most pronounced when comparing the $E_{N50}$ of resist 23000 which is greater then 50000 mJ/cm$^2$ to that of resist 23021 where it is 952 mJ/cm$^2$. The sensitizer containing resists, 23014 and 23016, do not exhibit an $E_{N50}$ below 4800 mJ/cm$^2$, but the onset of negative behavior, $E_{ONB}$, is about 25 times lower than that of the HSQ without sensitizer. This shows that the radical generators act to significantly increase the sensitivity of the resist with no PAB and with 193-nm exposure in nitrogen. The results show that the contrast is high for some resists and these resists are expected to be capable of being used as high resolution resists.

Example 6

Comparison of HSQ Based Resist with 125° C. PAB at 193-nm in Nitrogen

Resists 23000, 23016, 23017, 23022, 23023, 23030, and 23032 were coated to 250-nm on 140-nm AR3 on a silicon wafer, PAB baked at 125° C. for 60 s, exposed at 193-nm in nitrogen, and developed for 150 s with LDD-26W. Results are given in Table 5.

TABLE 5

Lithographic performance with 125° C. PAB with 193-nm exposure in nitrogen.

| Resist | Parts Sensitizer | Sensitizer | $E_{N50}$ (mJ/cm$^2$) | Contrast ($\gamma$) | $E_{ONB}$ (mJ/cm$^2$) |
|---|---|---|---|---|---|
| 23000 | 0 | none | >50000 | na | 40000 |
| 23016 | 1 | Irgacure I-819 | >4800 | na | 3546 |
| 23017 | 3 | Irgacure I-819 | 2709 | 2.2 | 1500 |
| 23022 | 6 | Irgacure I-819 | 1732 | 2.7 | 1190 |
| 23023 | 9 | Irgacure I-819 | 1601 | 2.6 | 1341 |
| 23020 | 1 | Irgacure I-651 | >4800 | na | >4800 |
| 23021 | 3 | Irgacure I-651 | >4800 | na | >4800 |
| 23032 | 3 | Darocur TPO | 1521 | 1.8 | 971 |
| 23030 | 6 | Darocur TPO | 1269 | 2.6 | 871 |

The HSQ without sensitizer does not have a measurable $E_{N50}$ with exposure doses up to 50 J/cm$^2$ while the sensitized HSQ resists exhibit measurable $E_{N50}$ doses from 1200 to 2800 mJ/cm$^2$. The Irgacure 1-651 does not act a sensitizer under these conditions and does have a measurable $E_{N50}$ or $E_{ONB}$ with exposure doses up to 4.8 J/cm$^2$. The example shows that the sensitivity of the resists containing the radical generator sensitizers in amounts from 1% to 9% is at least 18 to 39 times greater than the resist that does not contain the radical generators. The sensitization is most pronounced when comparing the $E_{N50}$ of resist 23000 which is greater then 50000 mJ/cm$^2$ to that of resist 23030 where it is 1269 mJ/cm$^2$. The sensitizer containing resist, 23016, does not exhibit an $E_{N50}$ below 4800 mJ/cm$^2$, but the onset of negative behavior, $E_{ONB}$, is over 10 times lower than that of the HSQ without sensitizer. This shows that the radical generators act to significantly increase the sensitivity of the resist with a 125° C. PAB and with 193-nm exposure in nitrogen. The results show that the contrast is high for some resists and these resists are thus capable of being used as high resolution resists.

Example 7

Comparison of HSQ Based Resist with 125° C. PAB at 193-nm in Nitrogen with 10,000 ppm Oxygen Resists 23000, 23016, 23017, 23022, and 23023 were coated to 250-nm on 140-nm AR3 on a silicon wafer, PAB baked at 125° C. for 60 s, exposed at 193-nm in nitrogen with 10,000 ppm oxygen, and developed for 150 s with LDD-26W. Results are given in Table 6.

TABLE 6

Lithographic performance with 125° C. PAB with 193-nm exposure in nitrogen with 10,000 ppm oxygen.

| Resist | Parts Sensitizer | Sensitizer | $E_{N50}$ (mJ/cm$^2$) | Contrast ($\gamma$) | $E_{ONB}$ (mJ/cm$^2$) |
|---|---|---|---|---|---|
| 23000 | 0 | none | >50000 | na | >50000 |
| 23016 | 1 | Irgacure I-819 | >4800 | na | 3386 |
| 23017 | 3 | Irgacure I-819 | 2559 | 2.1 | 1700 |
| 23022 | 6 | Irgacure I-819 | 1909 | 10.7 | 1712 |
| 23023 | 9 | Irgacure I-819 | 1860 | 16.9 | 1737 |

The HSQ without sensitizer does not have a measurable $E_{N50}$ with exposure doses up to 50 J/cm$^2$ while the sensitized HSQ resists exhibit measurable $E_{N50}$ doses from 1800 to 2600 mJ/cm$^2$. The example shows that the sensitivity of the resist containing the radical generator sensitizer in amounts from 3% to 9% is at least 20 to 27 times greater than the resist that does not contain the radical generators. The sensitization is most pronounced when comparing the $E_{N50}$ of resist 23000 which is greater then 50000 mJ/cm² to that of resist 23023 where it is 1860 mJ/cm². The sensitizer containing resist, 23016, does not exhibit an $E_{N50}$ below 4800 mJ/cm², but the onset of negative behavior, $E_{ONB}$, is at least 15 times lower than that of the HSQ without sensitizer. This shows that the radical generator acts to significantly increase the sensitivity of the resist with a 125° C. PAB and with 193-nm exposure in nitrogen with 10,000 ppm oxygen. The results show that the contrast is high for some resists and these resists are thus capable of being used as high resolution resists.

Example 8

Comparison of HSQ Based Resist with 100° C. PAB at 193-nm in Nitrogen

Resists 23000, 23017, 23029, 23030, 23031, and 23032 were coated to 250-nm on 140-nm AR3 on a silicon wafer, with 100° C. PAB, exposed at 193-nm in nitrogen, and developed for 150 s with LDD-26W. Results are given in Table 7.

TABLE 7

Lithographic performance with 100° C. PAB with 193-nm exposure in nitrogen.

| Resist | Parts Sensitizer | Sensitizer | $E_{N50}$ (mJ/cm²) | Contrast (γ) | $E_{ONB}$ (mJ/cm²) |
|---|---|---|---|---|---|
| 23000 | 0 | none | >50000 | na | 50000 |
| 23017 | 3 | Irgacure I-819 | 3712 | 0.4 | 2285 |
| 23031 | 3 | Irgacure I-2959 | >4800 | na | 2177 |
| 23029 | 6 | Irgacure I-2959 | >4800 | na | 2107 |
| 23032 | 3 | Darocur TPO | 1962 | 1.4 | 1200 |
| 23030 | 6 | Darocur TPO | 1340 | 2.3 | 966 |

The HSQ without sensitizer does not have a measurable $E_{N50}$ with exposure doses up to 50 J/cm² while some of the sensitized HSQ resists exhibit measurable $E_{N50}$ doses from 1300 to 3800 mJ/cm². The example shows that the sensitivity of some resists containing the radical generator sensitizers in amounts from 3% to 6% is at least 13 to 37 times greater than the resist that does not contain the radical generators. The sensitization is most pronounced when comparing the $E_{N50}$ of resist 23000 which is greater then 50000 mJ/cm² to that of resist 23032 where it is 1340 mJ/cm². The sensitizer containing resists, 23029 and 23031, do not exhibit an $E_{N50}$ below 4800 mJ/cm², but the onset of negative behavior, $E_{ONB}$, is over 22 times lower than that of the HSQ without sensitizer. This shows that the radical generator acts to significantly increase the sensitivity of the resist with a 100° C. PAB and with 193-nm exposure in nitrogen. The results show that the contrast is high for some resists and these resists are thus capable of being used as high resolution resists.

Example 9

Comparison of HSQ Based Resist with 100° C. PAB at 193-nm in Air

Resists 23017, 23029, 23030, 23031, and 23032 were coated to 250-nm on 140-nm AR3 on a silicon wafer, with 100° C. PAB, exposed at 193-nm in air, and developed for 150 s with LDD-26W. Results are given in Table 8.

TABLE 8

Lithographic performance with 100° C. PAB with 193-nm exposure in air.

| Resist | Parts Sensitizer | Sensitizer | $E_{N50}$ (mJ/cm²) | Contrast (γ) | $E_{ONB}$ (mJ/cm²) |
|---|---|---|---|---|---|
| 23000 | 0 | none | >50000 | na | >50000 |
| 23017 | 3 | Irgacure I-819 | 4743 | 2.2 | 3200 |
| 23031 | 3 | Irgacure I-2959 | >4800 | na | 4600 |
| 23029 | 6 | Irgacure I-2959 | >4800 | na | 4278 |
| 23032 | 3 | Darocur TPO | 3363 | 2.4 | 2000 |
| 23030 | 6 | Darocur TPO | 2015 | 1.3 | 1240 |

The HSQ without sensitizer does not have a measurable $E_{N50}$ with exposure doses up to 50 J/cm² while the sensitized HSQ resists exhibit measurable $E_{N50}$ doses from 2000 to 4800 mJ/cm². The example shows that the sensitivity of the resists containing the radical generator sensitizers in amounts from 3% to 6% is at least 10 to 25 times greater than the resist that does not contain the radical generators. The sensitization is most pronounced when comparing the $E_{N50}$ of resist 23000 which is greater then 50000 mJ/cm² to that of resist 23030 where it is 2015 mJ/cm². The sensitizer containing resists, 23029 and 23031, do not exhibit an $E_{N50}$ below 4800 mJ/cm², but the onset of negative behavior, $E_{ONB}$, is over 10 times lower than that of the HSQ without sensitizer. This shows that the radical generator acts to significantly increase the sensitivity of the resist with a 100° C. PAB and with 193-nm exposure in air. The results show that the contrast is high for some resists and these resists are thus capable of being used as high resolution resists.

Example 10

Comparison of HSQ Based Resist with No PAB at 193-nm in Air

Resists 23017, 23029, 23030, 23031, and 23032 were coated to 250-nm on 140-nm AR3 on a silicon wafer, with no PAB, exposed at 193-nm in air, and developed for 150 s with LDD-26W. Results are given in Table 9.

TABLE 9

Lithographic performance with no PAB with 193-nm exposure in air.

| Resist | Parts Sensitizer | Sensitizer | $E_{N50}$ (mJ/cm²) | Contrast (γ) | $E_{ONB}$ (mJ/cm²) |
|---|---|---|---|---|---|
| 23000 | 0 | none | >50000 | na | >50000 |
| 23017 | 3 | Irgacure I-819 | 4379 | 4.0 | 3143 |
| 23031 | 3 | Irgacure I-2959 | >4800 | na | 3400 |
| 23029 | 6 | Irgacure I-2959 | >4800 | na | 1665 |
| 23020 | 1 | Irgacure I-651 | >4800 | na | >4800 |
| 23021 | 3 | Irgacure I-651 | 2275 | 6.1 | 1200 |
| 23032 | 3 | Darocur TPO | 3422 | 2.4 | 2200 |
| 23030 | 6 | Darocur TPO | 2131 | 1.9 | 1349 |

The HSQ without sensitizer does not have a measurable $E_{N50}$ with exposure doses up to 50 J/cm² while the sensitized HSQ resists exhibit measurable $E_{N50}$ doses from 2100 to 4400 mJ/cm². The example shows that the sensitivity of the resists containing the radical generator sensitizers in amounts from 3% to 6% is at least 11 to 24 times greater than the resist that does not contain the radical generators. The sensitization is most pronounced when comparing the $E_{N50}$ of resist 23000 which is greater then 50000 mJ/cm² to that of resist 23030 where it is 2131 mJ/cm². The sensitizer containing resists, 23020, 23029, and 23031, do not exhibit an $E_{N50}$ below 4800 mJ/cm², but the onset of negative behavior, $E_{ONB}$, is over 14 times lower than that of the HSQ without sensitizer. The sensitizer containing resist, 23021, does not exhibit an $E_{N50}$ or $E_{ONB}$ below 4800 mJ/cm². This shows that the radical generator acts to significantly increase the sensitivity of the resist with no PAB and with 193-nm exposure in air. The results show that the contrast is high for some resists and these resists are thus capable of being used as high resolution resists.

Example 11

Comparison of HSQ Based Resist with 125° C. PAB at 193-nm in Air

Resists 23030 and 23032 were coated to 250-nm on 140-nm AR3 on a silicon wafer, with 125° C. PAB, exposed at 193-nm in air, and developed for 150 s with LDD-26W. Results are given in Table 10.

TABLE 10

Lithographic performance with 125° C. PAB with 193-nm exposure in air.

| Resist | Parts Sensitizer | Sensitizer | $E_{N50}$ (mJ/cm²) | Contrast (γ) | $E_{ONB}$ (mJ/cm²) |
|---|---|---|---|---|---|
| 23000 | 0 | none | >50000 | na | >50000 |
| 23020 | 1 | Irgacure I-651 | >4800 | na | >4800 |
| 23021 | 3 | Irgacure I-651 | >4800 | na | >4800 |
| 23032 | 3 | Darocur TPO | 1930 | 1.5 | 1100 |
| 23030 | 6 | Darocur TPO | 1427 | 2.1 | 900 |

The HSQ without sensitizer does not have a measurable $E_{N50}$ with exposure doses up to 50 J/cm² while the sensitized HSQ resists exhibit measurable $E_{N50}$ doses from 1400 to 2000 mJ/cm². The Irgacure 1-651 does not act a sensitizer under these conditions and does have a measurable $E_{N50}$ or $E_{ONB}$ with exposure doses up to 4.8 J/cm². The example shows that the sensitivity of some resists containing the radical generator sensitizers in amounts from 3% to 6% is at least 25 to 35 times greater than the resist that does not contain the radical generators. The sensitization is most pronounced when comparing the $E_{N50}$ of resist 23000 which is greater then 50000 mJ/cm² to that of resist 23030 where it is 1427 mJ/cm². This shows that the radical generator acts to significantly increase the sensitivity of the resist with a 125° C. PAB and with 193-nm exposure in air. The results show that the contrast is high for some resists and these resists are thus capable of being used as high resolution resists.

Example 12

Comparison of HSQ Based Resists with No PAB at 193-nm in Air or Nitrogen

Resists 23000, 23017, 23029, 23030, 23031, and 23032 were coated to 250-nm on 140-nm AR3 on a silicon wafer, with no PAB, exposed at 193-nm in either air or nitrogen, and developed for 150 s with LDD-26W. Results are given in Table 11.

TABLE 11

Lithographic performance with no PAB with 193-nm exposure in air or nitrogen.

| Resist | Parts Sensitizer | Sensitizer | Air $E_{N50}$ (mJ/cm²) | Nitrogen $E_{N50}$ (mJ/cm²) |
|---|---|---|---|---|
| 23000 | 0 | none | >50000 | >50000 |
| 23017 | 3 | Irgacure I-819 | 4379 | 2169 |
| 23031 | 3 | Irgacure I-2959 | >4800 | 3736 |
| 23029 | 6 | Irgacure I-2959 | >4800 | 2510 |
| 23020 | 1 | Irgacure I-651 | >4800 | 2838 |
| 23021 | 3 | Irgacure I-651 | 2275 | 952 |
| 23032 | 3 | Darocur TPO | 3422 | 1952 |
| 23030 | 6 | Darocur TPO | 2131 | 1420 |

The HSQ without sensitizer does not have a measurable $E_{N50}$ with exposure doses up to 50 J/cm² in either air or nitrogen. In all cases where a sensitizer is effective, the sensitivity is from 1.5 to 2.0 times greater in nitrogen then in air. This shows that the radical generator acts to significantly increase the sensitivity of the resist with no PAB and with 193-nm exposure in nitrogen relative to air.

Example 13

Comparison of HSQ Based Resist with 100° C. PAB at 193-nm in Air or Nitrogen

Resists 23017, 23029, 23030, 23031, and 23032 were coated to 250-nm on 140-nm AR3 on a silicon wafer, with 100° C. PAB, exposed at 193-nm in either air or nitrogen, and developed for 150 s with LDD-26W. Results are given in Table 12.

TABLE 12

Lithographic performance with 100° C. PAB with 193-nm exposure in air or nitrogen.

| Resist | Parts Sensitizer | Sensitizer | Air $E_{N50}$ (mJ/cm²) | Nitrogen $E_{N50}$ (mJ/cm²) |
|---|---|---|---|---|
| 23000 | 0 | none | >50000 | >50000 |
| 23017 | 3 | Irgacure I-819 | 4743 | 3712 |
| 23031 | 3 | Irgacure I-2959 | >4800 | >4800 |
| 23029 | 6 | Irgacure I-2959 | >4800 | >4800 |
| 23032 | 3 | Darocur TPO | 3363 | 1962 |
| 23030 | 6 | Darocur TPO | 2015 | 1340 |

The HSQ without sensitizer does not have a measurable $E_{N50}$ with exposure doses up to 50 J/cm² in either air or nitrogen. In all cases where a sensitizer is effective, the sensitivity is from 1.3 to 1.7 times greater in nitrogen then in air. This shows that the radical generator acts to significantly increase the sensitivity of the resist with a 100° C. PAB and with 193-nm exposure in nitrogen relative to air.

Example 14

Comparison of HSQ Based Resist with 125° C. PAB at 193-nm in 1% Oxygen in Nitrogen or Nitrogen Resists 23000, 23016, 23017, 23022, and 23023 were coated to 250-nm on 140-nm AR3 on a silicon wafer, PAB baked at 125° C. for 60 s, exposed at 193-nm in either 1% oxygen in nitrogen or nitrogen, and developed for 150 s with LDD-26W. Results are given in Table 13.

TABLE 13

Lithographic performance with 125° C. PAB with 193-nm exposure in 1% oxygen in nitrogen or nitrogen.

| Resist | Parts Sensitizer | Sensitizer | 1% Oxygen in Nitrogen $E_{N50}$ (mJ/cm$^2$) | Nitrogen $E_{N50}$ (mJ/cm$^2$) |
|---|---|---|---|---|
| 23000 | 0 | none | >50000 | >50000 |
| 23016 | 1 | Irgacure I-819 | >4800 | >4800 |
| 23017 | 3 | Irgacure I-819 | 2559 | 2709 |
| 23022 | 6 | Irgacure I-819 | 1909 | 1732 |
| 23023 | 9 | Irgacure I-819 | 1860 | 1601 |

The HSQ without sensitizer does not have a measurable $E_{N50}$ with exposure doses up to 50 J/cm$^2$ in either 1% oxygen in nitrogen or nitrogen. In all cases where a sensitizer is effective, the sensitivity is either similar or slightly greater in nitrogen then in 1% oxygen in nitrogen. This shows that the radical generator does not act to significantly increase the sensitivity of the resist with a 125° C. PAB and with 193-nm exposure in nitrogen relative to 1% oxygen in nitrogen.

Example 15

Comparison of HSQ Based Resist with 125° C. PAB at 193-nm in Air or Nitrogen

Resists 23030 and 23032 were coated to 250-nm on 140-nm AR3 on a silicon wafer, with 125° C. PAB, exposed at 193-nm in either air or nitrogen, and developed for 150 s with LDD-26W. Results are given in Table 18.

TABLE 14

Lithographic performance with 125° C. PAB with 193-nm exposure in air or nitrogen.

| Resist | Parts Sensitizer | Sensitizer | Air $E_{N50}$ (mJ/cm$^2$) | Nitrogen $E_{N50}$ (mJ/cm$^2$) |
|---|---|---|---|---|
| 23000 | 0 | none | >50000 | >50000 |
| 23020 | 1 | Irgacure I-651 | >4800 | >4800 |
| 23021 | 3 | Irgacure I-651 | >4800 | >4800 |
| 23032 | 3 | Darocur TPO | 1930 | 1521 |
| 23030 | 6 | Darocur TPO | 1427 | 1269 |

The HSQ without sensitizer does not have a measurable $E_{N50}$ with exposure doses up to 50 J/cm$^2$ in either air or nitrogen. The HSQ with Irgacure 1-651 sensitizer does not have a measurable $E_{N50}$ with exposure doses up to 4.8 J/cm$^2$ in either air or nitrogen. In all cases where a sensitizer is effective, the sensitivity is from 1.1 to 1.3 times greater in nitrogen then in air. This shows that the radical generator acts to significantly increase the sensitivity of the resist with a 125° C. PAB and with 193-nm exposure in nitrogen relative to air.

EQUIVALENTS

While the present invention has been described in terms of specific methods, structures, and devices it is understood that variations and modifications will occur to those skilled in the art upon consideration of the present invention. As well, the features illustrated or described in connection with one embodiment can be combined with the features of other embodiments. Such modifications and variations are intended to be included within the scope of the present invention. Those skilled in the art will appreciate, or be able to ascertain using no more than routine experimentation, further features and advantages of the invention based on the above-described embodiments. Accordingly, the invention is not necessarily to be limited by what has been particularly shown and described.

All publications and references are herein expressly incorporated by reference in their entirety. The terms "a" and "an" can be used interchangeably, and are equivalent to the phrase "one or more" as utilized in the present application. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise specifically claimed. No language in the specification should be construed as indicating any non-claimed element as essential to the practice of the invention.

What is claimed is:

1. A method of performing a lithographic process, comprising:
   forming a resist on a substrate, the resist capable of being imaged by lithographic radiation, the resist comprising:
   a) a resist material comprising a monomeric or oligomeric hydrogen-bearing siloxane, and
   b) a sensitizer for increasing a sensitivity of the resist material to the lithographic radiation, the sensitizer comprising a radical generator capable of forming a free radical upon exposure to the lithographic radiation; and
   exposing the resist to the lithographic radiation, and
   contacting a developer with the resist to remove portions of the resist unexposed to the lithographic radiation.

2. The method of claim 1, wherein the step of forming the resist further comprises forming the resist such that the resist exhibits enhanced sensitivity relative to a resist with the sensitizer removed.

3. The method of claim 2, wherein the sensitivity of the resist is enhanced by at least about 10%.

4. The method of claim 2, wherein the sensitivity of the resist is enhanced by at least about 100%.

5. The method of claim 2, wherein the sensitivity of the resist is enhanced by at least about 1000%.

6. The method of claim 1, wherein the developer is tetramethylammonium hydroxide in water.

7. The method of claim 1, wherein the lithographic radiation includes at least one of electromagnetic radiation, ion beam, and electron beam.

8. The method of claim 7, wherein the electromagnetic radiation includes radiation having a wavelength in a range of about 0.1 nm to about 260 nm.

9. The method of claim 8, wherein the electromagnetic radiation includes radiation having a wavelength in the range of about 140 nm to about 220 nm.

10. The method of claim 7, wherein the lithographic radiation includes an electron beam.

11. The method of claim 1, wherein the resist material comprises a hydrogen silsesquioxane-based material.

12. The method of claim 11, wherein the hydrogen silsesquioxane-based material is a monomeric hydrogen silsesquioxane-based material.

13. The method of claim 1, wherein the radical generator comprises a non-basic radical generator.

14. The method of claim 1, wherein the method is used to manufacture at least one of an integrated circuit and a micro-electro-mechanical device.

15. The method of claim 1, wherein the method is an additive process used to perform at least one of producing and repairing a mask.

16. The method of claim 15, wherein the mask is at least one of a transmission mask and an imprint mask.

17. The method of claim 15, wherein the mask is a phase-shift mask.

18. The method of claim 1, wherein the step of exposing the resist comprises cleaving an alpha cleavage radical generator to form a free radical.

19. An enhanced sensitivity resist composition, comprising:
   a resist material comprising a monomeric or oligomeric hydrogen-bearing siloxane; and
   a sensitizer for increasing the sensitivity of the resist material upon exposure to lithographic radiation, the sensitizer comprising a radical generator capable of forming a free radical upon exposure to the lithographic radiation.

20. The composition of claim 19, wherein the composition is a mixture.

21. The composition of claim 19, wherein the resist material comprises a hydrogen silsesquioxane-based material.

22. The composition of claim 21, wherein the hydrogen silsesquioxane-based material is a monomeric hydrogen silsesquioxane-based material.

23. The composition of claim 19, wherein the radical generator further comprises a non-basic radical generator.

24. The composition of claim 19, wherein the sensitizer comprises less than about 50% by weight of the composition.

25. The composition of claim 19, wherein the sensitizer comprises greater than about 0.1% by weight of the composition.

26. The composition of claim 19, wherein the radical generator comprises an alpha cleavage radical generator.

27. A kit for forming a resist material used in lithographic applications, comprising the resist material and the sensitizer of claim 19.

28. The kit of claim 27, wherein the sensitizer and the resist material are separately compartmentalized.

29. An additive method of producing a mask, comprising:
   forming a resist on a substrate, the resist capable of being imaged by lithographic radiation, the resist comprising:
      a) a monomeric or oligomeric hydrogen-bearing siloxane, and
      b) a sensitizer for increasing a sensitivity of the resist material to the lithographic radiation, the sensitizer comprising a radical generator capable of forming a free radical upon exposure to the lithographic radiation;
   exposing the resist to the lithographic radiation; and
   contacting the resist with a developer to remove portions of the resist unexposed to the lithographic radiation, thereby producing a mask by adding resist material to portions of the substrate.

30. The method of claim 29 wherein the substrate is a mask and the additive method repairs defects in the mask by adding resist material to portions of the mask.

31. The method of claim 29, wherein the mask is at least one of a transmission mask, an imprint mask, or a phase-shift mask.

* * * * *